(12) United States Patent
Lee et al.

(10) Patent No.: US 9,497,853 B2
(45) Date of Patent: Nov. 15, 2016

(54) PRINTED CIRCUIT BOARD AND METHOD FOR MANUFACTURING THE SAME

(75) Inventors: Sang Myung Lee, Seoul (KR); Sung Woon Yoon, Seoul (KR); Hyuk Soo Lee, Seoul (KR); Sung Won Lee, Seoul (KR); Ki Do Chun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 196 days.

(21) Appl. No.: 13/997,544

(22) PCT Filed: Dec. 23, 2011

(86) PCT No.: PCT/KR2011/010026
§ 371 (c)(1),
(2), (4) Date: Nov. 15, 2013

(87) PCT Pub. No.: WO2012/087060
PCT Pub. Date: Jun. 28, 2012

(65) Prior Publication Data
US 2014/0054069 A1 Feb. 27, 2014

(30) Foreign Application Priority Data

Dec. 24, 2010 (KR) .................. 10-2010-0134481
Dec. 24, 2010 (KR) .................. 10-2010-0134484
Dec. 24, 2010 (KR) .................. 10-2010-0134487

(51) Int. Cl.
*H01B 13/00* (2006.01)
*H05K 1/11* (2006.01)
(Continued)

(52) U.S. Cl.
CPC ............ *H05K 1/0298* (2013.01); *H05K 3/202* (2013.01); *H05K 3/4647* (2013.01);
(Continued)

(58) Field of Classification Search
CPC .......... H05K 3/1208; H05K 2201/0364; H05K 2201/09209; H05K 2203/0117; H05K 2201/09518; H05K 2201/0376; H05K 2203/0369
USPC ..................... 174/262, 265, 267; 216/18
See application file for complete search history.

(56) References Cited

U.S. PATENT DOCUMENTS 5,442,143 A * 8/1995 Schmidt et al. .............. 174/262
2005/0153059 A1 7/2005 Wakizaka
(Continued)

FOREIGN PATENT DOCUMENTS

CN 101098584 A 1/2008
CN 101904230 A 12/2010
(Continued)

OTHER PUBLICATIONS

English Translation of Hitachi (JP 2008-124370A) provided with Office Action.*
(Continued)

*Primary Examiner* — Timothy Thompson
*Assistant Examiner* — Roshn Varghese
(74) *Attorney, Agent, or Firm* — Saliwanchik, Lloyd & Eisenschenk

(57) ABSTRACT

Disclosed are a printed circuit board and a method for manufacturing the same. The printed circuit board includes a core insulating layer, at least one via formed through the core insulating layer, an inner circuit layer buried in the core insulating layer, and an outer circuit layer on a top surface or a bottom surface of the core insulating layer, wherein the via includes a center part having a first width and a contact part having a second width, the contact part makes contact with a surface of the core insulating layer, and the first width is larger than the second width. The inner circuit layer and the via are simultaneously formed so that the process steps are reduced. Since odd circuit layers are provided, the printed circuit board has a light and slim structure.

15 Claims, 9 Drawing Sheets

(51) Int. Cl.
*H05K 1/02* (2006.01)
*H05K 3/46* (2006.01)
*H05K 3/20* (2006.01)

(52) U.S. Cl.
CPC ........... *H05K 3/4682* (2013.01); *H05K 3/465* (2013.01); *H05K 3/4652* (2013.01); *H05K 2201/098* (2013.01); *H05K 2203/0323* (2013.01); *H05K 2203/0376* (2013.01)

(56) References Cited

U.S. PATENT DOCUMENTS

| | | | |
|---|---|---|---|
| 2007/0070613 A1 | 3/2007 | Kang | |
| 2007/0163887 A1 | 7/2007 | Hofmann | |
| 2008/0000680 A1 | 1/2008 | Cho et al. | |
| 2008/0041823 A1* | 2/2008 | La et al. | 252/79.3 |
| 2008/0303146 A1 | 12/2008 | Wang | |
| 2009/0152719 A1 | 6/2009 | Lee | |
| 2009/0288872 A1* | 11/2009 | Kim et al. | 174/262 |
| 2010/0052993 A1* | 3/2010 | Kim | 343/700 MS |
| 2010/0264549 A1* | 10/2010 | Ko et al. | 438/460 |
| 2012/0077333 A1 | 3/2012 | Ko et al. | |

FOREIGN PATENT DOCUMENTS

| | | |
|---|---|---|
| JP | 2000-312063 A | 11/2000 |
| JP | 2001-044633 A | 2/2001 |
| JP | 2001-177240 A | 6/2001 |
| JP | 2003318534 A | 11/2003 |
| JP | 2004063701 A | 2/2004 |
| JP | 2004095914 A | 3/2004 |
| JP | 2004-140254 A | 5/2004 |
| JP | 2005-064203 A | 3/2005 |
| JP | 2005236006 A | 9/2005 |
| JP | 2006156500 A | 6/2006 |
| JP | 2006-228951 A | 8/2006 |
| JP | 2006313945 A | 11/2006 |
| JP | 2007-208193 A | 8/2007 |
| JP | 2008047843 A | 2/2008 |
| JP | 2008-124370 A | 5/2008 |
| KR | 10-2006-0133544 A | 12/2006 |
| KR | 10-2007-0035321 A | 3/2007 |
| KR | 10-2010-0114704 A | 10/2010 |
| TW | 200641967 | 12/2006 |
| WO | WO-03/072851 A1 | 9/2003 |

OTHER PUBLICATIONS

English Translation of Alps (JP2007-208193A) provided with Office Action.*
Alternative Machine Translation of Alps (JP 2007-208193A).*
International Search Report in International Application No. PCT/KR2011/010026, filed Dec. 23, 2011.
Notice of Allowance dated Apr. 27, 2012 in Korean Application No. 10-2010-0134481, filed Dec. 24, 2010.
Notice of Allowance dated Feb. 27, 2013 in Korean Application No. 10-2010-0134484, filed Dec. 24, 2010.
Notice of Allowance dated May 18, 2012 in Korean Application No. 10-2010-0134487, filed Dec. 24, 2010.
Office Action dated Dec. 26, 2011 in Korean Application No. 10-2010-0134487, filed Dec. 24, 2010.
Office Action dated Aug. 4, 2015 in Japanese Application No. 2013-546029.
Office Action dated Aug. 28, 2015 in Taiwanese Application No. 100147416.
Office Action dated Sep. 25, 2015 in Chinese Application No. 201180068547.X.

* cited by examiner

PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2011/010026, filed Dec. 23, 2011, which claims priority to Korean Application Nos. 10-2010-0134481, filed Dec. 24, 2010; 10-2010-0134484, filed Dec. 24, 2010; and 10-2010-0134487, filed Dec. 24, 2010, the disclosures of each of which are incorporated herein by reference in their entirety.

TECHNICAL FIELD

A printed circuit board is formed by printing circuit line patterns on an insulating substrate using a conductive material such as copper. The printed circuit board refers to a board before electronic parts have been mounted thereon. That is, the printed circuit board refers to a circuit board, in which mounting positions are defined on a flat plate to mount various types of electronic devices and circuit patterns are fixedly printed on the flat plate to connect the electronic devices with each other.

BACKGROUND ART

Such a printed circuit board (PCB) may be classified into a single-layer PCB and a multi-layer PCB, such as a build-up board.

The build-up board, that is, the multi-layer PCB is manufactured one-layer by one-layer and the quality of the multi-layer PCB is evaluated to improve the product yield of the multi-layer PCB. In addition, interconnection lines are precisely connected to manufacture a high-density and small-size PCB. According to the build-up process, interconnection lines are formed between layers to connect the layers to each other through via holes formed in the layers. Instead of a mechanical drilling work, a laser process is performed to form the via holes having a micro size.

FIG. 1 is a sectional view showing a multi-layer PCB according to the related art.

Referring to FIG. 1, the multi-layer PCB 10 according to the related art includes a core insulating layer 1, inner circuit pattern layers 3 and 4 formed on and under the core insulating layer 1, upper and lower insulating layers 5 and 6 burying the inner circuit pattern layers 3 and 4 and outer circuit pattern layers 7 and 8 formed on the upper and lower insulating layers 5 and 6, respectively.

A conductive via 2 and conductive via holes are formed in the core insulating layer 1 and the upper and lower insulating layers 5 and 6 to electrically connect the inner circuit pattern layers 3 and 4 to the outer circuit pattern layers 7 and 8.

The multi-layer PCB 10 having the above structure according to the related art can be manufactured by forming even circuit pattern layers (four layers are shown in FIG. 1). After depositing insulating layers, two layers serving as outer layers are electrically connected to each other through the drilling work or the laser process. However, since the number of the circuit pattern layers is limited to the even number, a thickness of the substrate may be increased, so that the multi-layer PCB 10 may not be applicable for the portable electronic appliances or the substrates having the light and slim structure, such as semiconductor chips.

DISCLOSURE OF INVENTION

Technical Problem

The embodiment provides a printed circuit board having a novel structure and a method for manufacturing the same.

The embodiment provides a printed circuit board including odd circuit layers and a method for manufacturing the same.

Solution to Problem

A printed circuit board according to the embodiment includes a core insulating layer, at least one via formed through the core insulating layer, an inner circuit layer buried in the core insulating layer, and an outer circuit layer on a top surface or a bottom surface of the core insulating layer, wherein the via includes a center part having a first width and a contact part having a second width, the contact part makes contact with a surface of the core insulating layer, and the first width is larger than the second width.

A printed circuit board according to the embodiment includes a core insulating layer, at least one via formed through the core insulating layer, an inner circuit layer buried in the core insulating layer, and an outer circuit layer on a top surface or a bottom surface of the core insulating layer, wherein a circuit layer including the inner circuit layer and the outer circuit layer has a number of 2n+1 (n is a positive integer).

A method for manufacturing a printed circuit board according to the embodiment includes the steps of forming at least one via and an inner circuit layer by etching a metal substrate, forming an insulating layer to bury the via, and forming an outer circuit layer on a top surface or a bottom surface of the insulating layer.

Advantageous Effects of Invention

According to the embodiment, the inner circuit layer and the vias are simultaneously formed, so that the process steps can be reduced. In addition, since the printed circuit board includes odd circuit layers, the printed circuit board may have the light and slim structure.

In addition, the vias are buried in the insulating layer of the multi-layer printed circuit board, so the heat dissipation function can be improved. Since the plating method is not adopted to form the vias, the manufacturing cost can be reduced.

Further, the outer circuit layer can be prepared in the form of a buried circuit pattern, so the micro pattern can be provided.

BEST MODE FOR CARRYING OUT THE INVENTION

Figure 1:
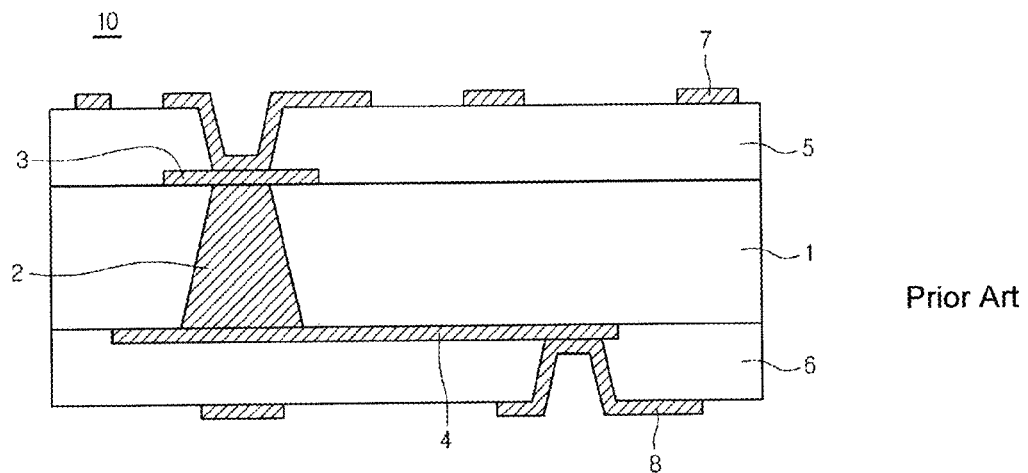
FIG. 1 is a sectional view showing a printed circuit board according to the related art.

Disclosed are a printed circuit board and a method for manufacturing the same. The printed circuit board includes a core insulating layer, at least one via formed through the core insulating layer, an inner circuit layer buried in the core insulating layer, and an outer circuit layer on a top surface or a bottom surface of the core insulating layer, wherein the via includes a center part having a first width and a contact part having a second width, the contact part makes contact with a surface of the core insulating layer, and the first width is larger than the second width. The inner circuit layer and the via are simultaneously formed so that the process steps are reduced. Since odd circuit layers are provided, the printed circuit board has a light and slim structure.

Mode for the Invention

Hereinafter, the embodiments will be described with reference to accompanying drawings in detail so that those skilled in the art to which the invention pertains can easily realize the embodiments. However, the embodiments may have various modifications without limitation.

In the following description, when a part is referred to as it includes a component, the part may not exclude other components but further include another component unless the context indicates otherwise.

The thickness and size of each layer shown in the drawings may be exaggerated, omitted or schematically drawn for the purpose of convenience or clarity. In addition, the size of elements does not utterly reflect an actual size. In the following description, the similar components will be assigned with the similar reference numerals.

In the description of the embodiments, it will be understood that, when a layer (or film), a region, or a plate is referred to as being on or under another layer (or film), another region, or another plate, it can be directly or indirectly on the other layer (or film), region, or plate, or one or more intervening layers may also be present.

According to the embodiment, a via and an inner circuit layer are simultaneously formed through the etching process, so that a multi-layer printed circuit board (PCB) including odd circuit layers can be formed without using the plating method.

Hereinafter, the PCB according to the embodiment will be described with reference to FIGS. 2 to 13.

Figure 2:
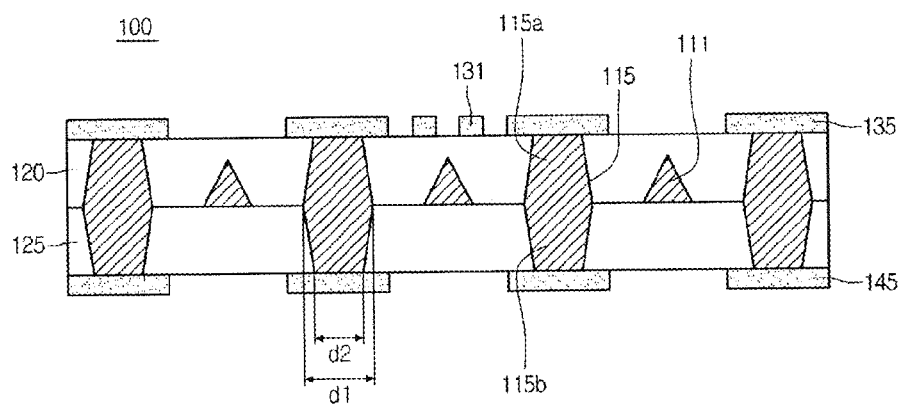
FIG. 2 is a sectional view showing a printed circuit board according to the first embodiment.

FIG. 2 is a sectional view showing the PCB according to the first embodiment.

Referring to FIG. 2, the PCB 100 according to the embodiment includes a core insulating layer forming a first insulating layer 120 and a second insulating layer 125, vias 115 formed in the core insulating layer, an inner circuit layer 111 formed in the core insulating layer, and first and second outer circuit layers 131, 135 and 145 formed on the first and second insulating layers 120 and 125, respectively.

The first insulating layer 120 is formed on the second insulating layer 125 and an additional insulating layer (not shown) may be present between the first and second insulating layers 120 and 125.

The first and second insulating layers 120 and 125 may include a thermosetting polymer substrate, a thermoplastic polymer substrate, a ceramic substrate or an organic/inorganic composite substrate. The first and second insulating layers 120 and 125 may include polymer resin, such as epoxy insulating resin, or polyimide resin. In addition, the first and second insulating layers 120 and 125 can be formed by using resin including solid components, such as glass fiber.

The first and second insulating layers 120 and 125 can be formed by using the same material.

The first and second insulating layers 120 and 125 may have a thickness in the range of 30 μm to 80 μm, respectively.

The thickness of the core insulating layer having the stack structure of the first and second insulating layers 120 and 125 is in the range of 60 μm to 160 μm, preferably, in the range of 60 μm to 140 μm. The vias 115 and the inner circuit layer 111 are formed in the core insulating layer.

The vias 115 are conductive vias formed through the first and second insulating layers 120 and 125. The vias 115 have the largest width d1 at the boundary between the first and second insulating layers 120 and 125. The width of each via 115 is gradually narrowed as it reaches the top surface of the first and second insulating layers 120 and 125. Thus, a section of each via 115 meeting with the top surface of the first and second insulating layers 120 and 125 has the smallest width d2, so that the via 115 has a hexagonal sectional shape.

The widths d1 and d2 of the via 115 are in the range of about 20 μm to about 100 μm.

The via 115 is a conductive via and can be formed by using an alloy including Cu.

The inner circuit layer 111 is formed on the second insulating layer 125

The inner circuit layer 111 is formed on the second insulating layer 125. A circuit pattern of the inner circuit layer 111 has the thickness in the range of about 6 μm to 30 μm, and the width of about 50 μm or less, preferably, 30 μm, so that the micro pattern can be formed.

The inner circuit layer 111 has a triangular sectional shape.

The inner circuit layer 111 is formed by using a material the same as that of the third part 115c of the via 115.

The outer circuit layers 131, 135 and 145 including via pads 135 and 145 connected to the via 115 and the circuit pattern 131 are formed on the top and bottom surfaces of the first and second insulating layers 120 and 125, respectively.

The outer circuit layers 131, 135 and 145 are classified into the first outer circuit layers 131 and 135 formed on the core insulating layer and the second outer circuit layer 145 formed under the core insulating layer.

The outer circuit layers 131, 135 and 145 may form the micro pattern having the line/space of 30/30. To this end, a copper layer having the thickness in the range of 6 μm to 30 μm is deposited and then the copper layer is etched to form the outer circuit layers 131, 135 and 145.

Although it has been described in that the outer circuit layers 131, 135 and 145 are formed on and under the core insulating layer in the form of a single layer, the embodiment is not limited thereto. For instance, after forming an upper insulating layer for burying the outer circuit layers 131, 135 and 145 on the first and second insulating layers 120 and 125, the circuit layer can be formed on the upper insulating layer to form the multi-layer PCB.

As described above, since the inner circuit layer 111 is buried in the core insulating layer of the PCB 100 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 115 including the conductive material are formed in the core insulating layer, the heat dissipation efficiency can be improved.

Hereinafter, the method for manufacturing the PCB of FIG. 2 will be described with reference to FIGS. 3 to 13.

Figure 3:
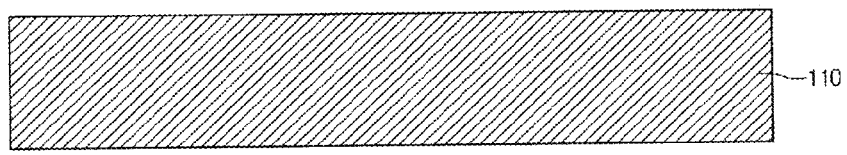
FIGS. 3 to 13 are sectional views for explaining the manufacturing procedure for the printed circuit board shown in FIG. 2.

First, a conductive metal substrate 110 is prepared as shown in FIG. 3.

The conductive metal substrate 110 can be formed by using an alloy including Cu in the form of a rolled foil or an electrolytic foil. The conductive metal substrate 110 may have various thicknesses according to the specification of the product. The metal substrate 110 preferably has the thickness in the range of 80 μm to 170 μm. The surface of the metal substrate 110 can be treated through a surface treatment process, such as pickling or flushing.

Figure 4:
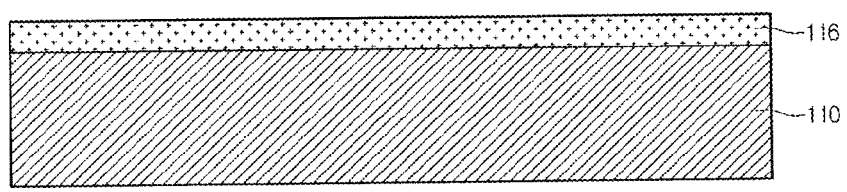

Then, as shown in FIG. 4, a photoresist film 116 is attached onto the top surface of the metal substrate 110.

The photoresist film 116 forms an etching pattern to etch the metal substrate 110. The photoresist film 116 may have various thicknesses in the range of 15 μm to 30 μm, and both of the UV exposure type photoresist film and the LDI exposure type photoresist film can be employed.

Figure 5:
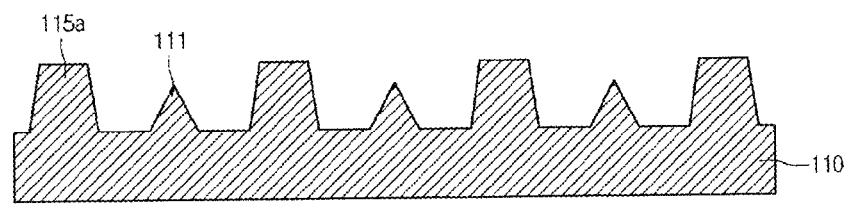

After that, as shown in FIG. 5, the photoresist film 116 is subject to the exposure and development process to form a photoresist pattern (not shown) and the metal substrate 110 is etched by using the photoresist pattern as a mask, thereby forming a first part 115a of the via 115 and the inner circuit layer 111.

Then, a part of the metal substrate 110 is wet etched by using wet etching solution, such as cupric chloride and iron chloride, to simultaneously form the first part 115a of the via 115 and the inner circuit layer 111. The thickness of the photoresist pattern can be adjusted such that the height of the first part 115a of the via 115 can be different from the height of the inner circuit layer 111.

Although there is height difference between the first part 115a of the via 115 and the inner circuit layer 111, since the first part 115a of the via 115 and the inner circuit layer 111 are simultaneously etched, the inner circuit layer 111 may have the triangular sectional shape.

As shown in FIG. 5, after the first part 115a of the via 115 and the inner circuit layer 111 have been etched, the photoresist pattern is delaminated by using the NaOH diluted solution.

Figure 6:
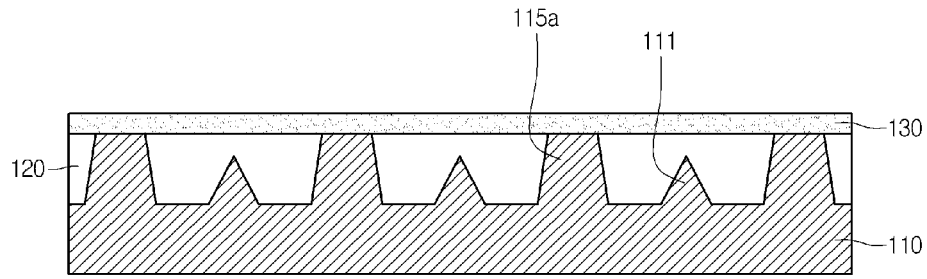

Next, as shown in FIG. 6, the first insulating layer 120 is formed in such a manner that the first part 115a of the via 115 and the inner circuit layer 111 can be buried in the first insulating layer 120.

The first insulating layer 120 can be formed by using thermosetting resin or thermoplastic resin having the solid component, such as glass fiber, or having no solid component. The first insulating layer 120 may have the thickness in the range of about 30 μm to about 80 μm.

Then, a copper foil layer 130 is formed on the first insulating layer 120.

The copper foil layer 130 is a metal layer serving as a base of the first outer circuit layers 131 and 135 and has the thickness in the range of 6 μm to 30 μm such that the line/space can be formed as to 30/30 μm. Preferably, the copper foil layer 130 has the thickness in the range of 6 μm to 20 μm such that the line/space can be formed as to 15/15 μm or below.

The first insulating layer 120 and the copper foil layer 130 can be formed by using CCL (copper cladded laminate).

Figure 7:
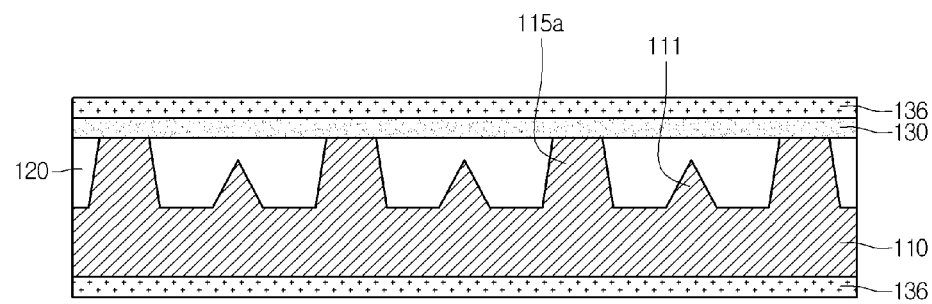

Then, as shown in FIG. 7, photoresist films 136 are formed on the copper foil layer 130 and under the metal substrate 110, respectively.

The photoresist film 136 formed under the metal substrate 110 serves as a base to form a photoresist pattern used to form a second part 115b of the via 115 and the inner circuit layer 111. In addition, the photoresist film 136 formed on the copper foil layer 130 serves as a base to form a photoresist pattern under the metal substrate 110 and as a protective film to protect the copper foil layer 130 during the etching process for the metal substrate 110.

Thus, the photoresist film 136 formed on the copper foil layer 130 can be replaced with a protective film or a protective organic layer and can be omitted.

Figure 8:
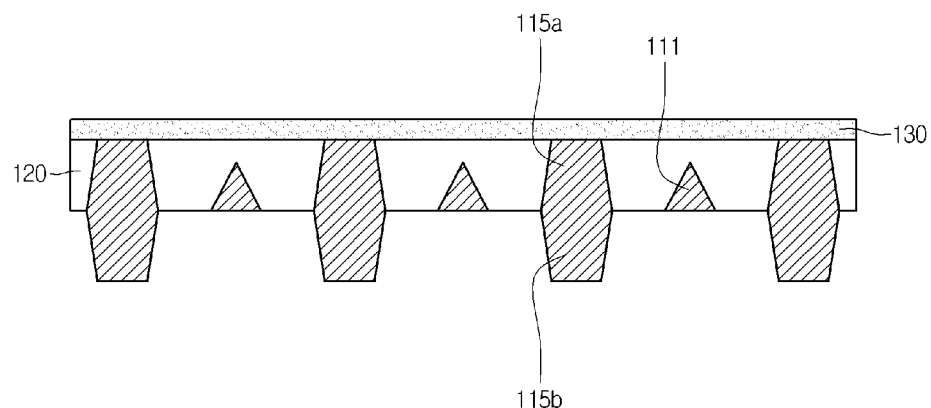

After that, as shown in FIG. 8, the photoresist film 136 formed under the metal substrate 110 is developed to form the photoresist pattern and the metal substrate 110 is etched by using the photoresist pattern as a mask, thereby forming the second part 115b under the first part 115a of the via 115.

In this manner, upper and lower portions of the via 115 are divided into first and second parts 115a and 115b and 115c through the etching process so that the via 115 has the hexagonal sectional shape in which the center of the via 115 has the largest width d1 and the width becomes narrow from the center to the outer portion of the via 115.

Figure 9:
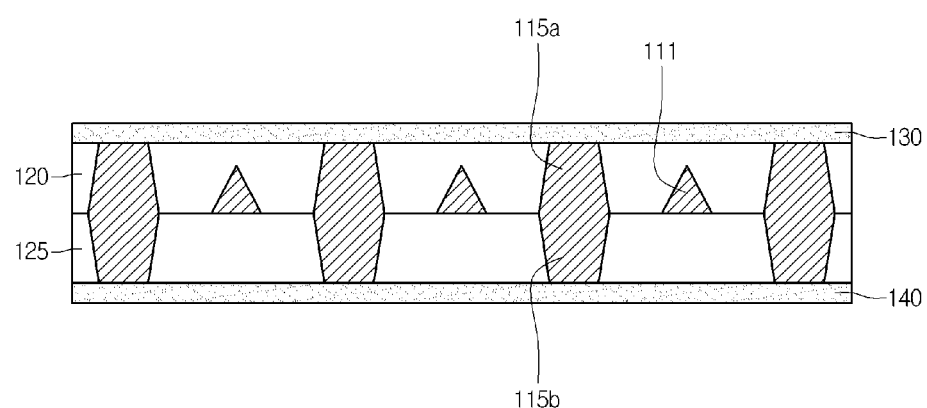

As the second part 115b of the via 115 has been formed, the photoresist pattern is delaminated. Then, as shown in FIG. 9, the second insulating layer 125 is deposited such that the first part 115a of the via 115 can be buried in the second insulating layer 125 and a copper foil layer 140 is deposited on the second insulating layer 125.

The material and the thickness of the second insulating layer 125 and the copper foil layer 140 may be identical to those of the first insulating layer 120 and the copper foil layer 130 formed on the first insulating layer 120.

Figure 10:
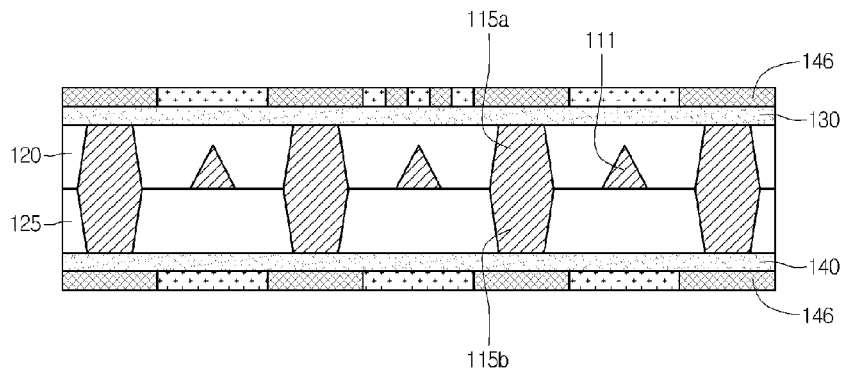

Then, as shown in FIG. 10, photoresist films 146 are attached onto the copper foil layers 130 and 140, respectively.

The photoresist films 146 may have various thicknesses in the range of 15 μm to 30 μm and both of the UV exposure type photoresist film and the LDI exposure type photoresist film can be employed.

Figure 11:
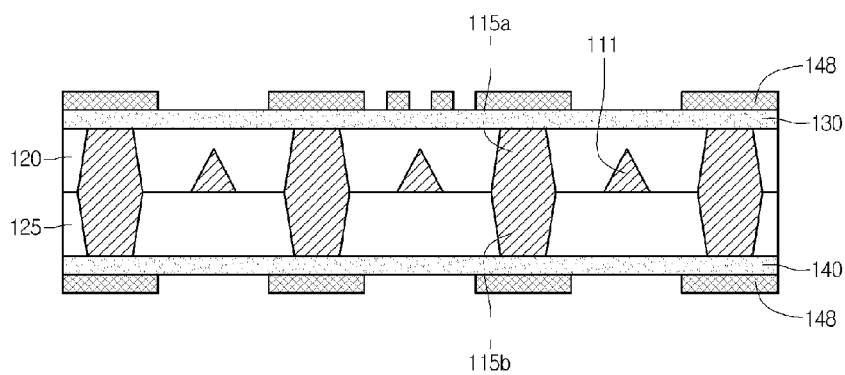
Figure 12:
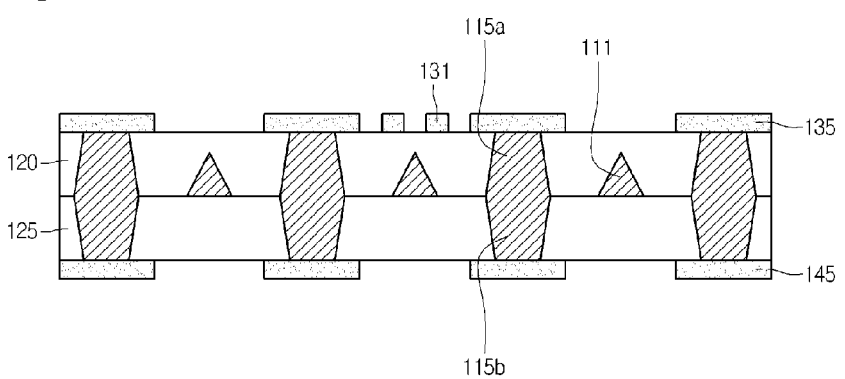

Then, the photoresist films 146 are subject to the exposure and development process so that photoresist patterns 148 are formed on the copper foil layers 130 and 140, respectively, as shown in FIG. 11. After that, the copper foil layers 130 and 140 are etched by using the photoresist patterns 148 as a mask, thereby forming the pads 135 and 145 and the circuit pattern 131 as shown in FIG. 12.

The pads 135 and 145 and the circuit pattern 131 may constitute the first outer circuit layers 131 and 135 formed on the first insulating layer 120 and the second outer circuit layer 145. The first outer circuit layers 131 and 135 include the upper pad 135 connected to the first part 115a of the via 115 and the upper circuit pattern 131 including the copper foil layer 130 identical to the copper foil layer 130 of the upper pad 135. The second outer circuit layer 145 includes the lower pad 145 connected to the second part 115b of the via 115 and a lower circuit pattern (not shown) including the copper foil layer 140 identical to the copper foil layer 140 of the lower pad 145.

Figure 13:
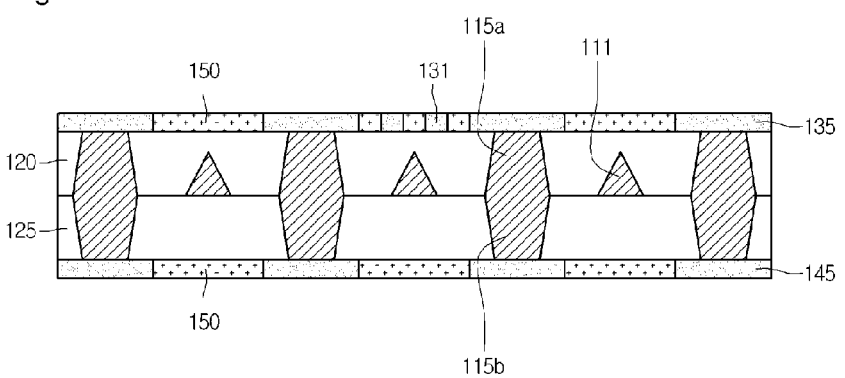

Finally, as shown in FIG. 13, the circuit pattern 131 of the outer circuit layers 131, 135 and 145 is buried and a coverlay 150 is formed to expose the pads 135 and 145.

In this manner, different from the related art in which the via hole is formed by drilling the insulating layer and the via is formed by burying the via hole, the embodiment forms the insulating layers 120 and 125 burying the via 115 after forming the via 115 by etching the metal substrate 110, thereby reducing the manufacturing cost. In addition, since the inner circuit layer 111 is formed by using the metal substrate identical to the via 115, the manufacturing steps can be reduced.

Hereinafter, a PCB according to the second embodiment will be described with reference to FIG. 14.

Figure 14:
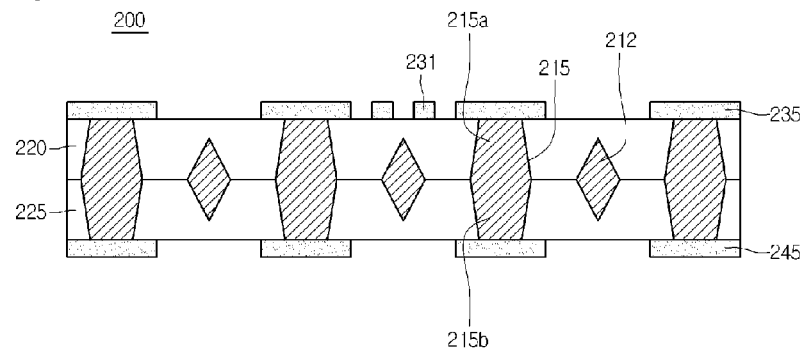
FIG. 14 is a sectional view showing a printed circuit board according to the second embodiment.

Referring to FIG. 14, the PCB 200 according to the second embodiment includes a core insulating layer forming a first insulating layer 120 and a second insulating layer 125, vias 115 formed in the core insulating layer, an inner circuit layer 112 formed in the core insulating layer, and first and second outer circuit layers 131, 135 and 145 formed on the first and second insulating layers 120 and 125, respectively.

The first insulating layer 120 is formed on the second insulating layer 125 and an additional insulating layer may be present between the first and second insulating layers 120 and 125.

The first and second insulating layers 120 and 125 can be formed by using resin including solid components, such as glass fiber. The first and second insulating layers 120 and 125 can be formed by using the same material.

The first and second insulating layers 120 and 125 have a stack structure to form the core insulating layer. The core insulating layer may have a thickness in the range of about 60 μm to about 140 μm. The via 115 and the inner circuit layer 112 are formed in the core insulating layer.

The vias 115 are conductive vias formed through the first and second insulating layers 120 and 125. The vias 115 have the largest width d1 at the boundary between the first and second insulating layers 120 and 125. The width of each via 115 is gradually narrowed as it reaches the top surface of the first and second insulating layers 120 and 125. Thus, the via 115 has a hexagonal sectional shape.

The widths d1 and d2 of the via 115 are in the range of about 20 μm to about 100 μm.

The via 115 is a conductive via formed by using an alloy including Cu.

The inner circuit layer 112 has a rectangular sectional shape and has the width of about 60 μm or less, preferably, 50 μm, so that the micro pattern can be formed.

The inner circuit layer 112 is formed by using a material the same as that of the via 115.

The outer circuit layers 131, 135 and 145 including via pads 135 and 145 connected to the via 115 and the circuit pattern 131 are formed on the top and bottom surfaces of the first and second insulating layers 120 and 125, respectively.

The outer circuit layers 131, 135 and 145 are formed on the surfaces of the first and second insulating layers 120 and 125 and the inner circuit layer 112 is formed on the second insulating layer 125.

The outer circuit layers 131, 135 and 145 can be formed by depositing the copper foil layer and then etching the copper foil layer.

In the PCB 200 shown in FIG. 14, the circuit pattern of the inner circuit layer 112 has a rectangular sectional shape or a lozenge sectional shape, which is symmetrically formed about the boundary between the first and second insulating layers 120 and 125 similar to the via 115. In detail, a part of the inner circuit layer 112 is buried in the first insulating layer 120 and the remaining part of the inner circuit layer 112 is buried in the second insulating layer 125.

The inner circuit layer 112 shown in FIG. 14 can be formed by using the manufacturing method shown in FIGS. 3 to 13. In the process shown in FIGS. 7 and 8, when the second part 115b of the via 115 is formed, the region to be buried in the second insulating layer 125 of the inner circuit layer 112 can be simultaneously formed.

As described above, since the inner circuit layer 112 is buried in the core insulating layer of the PCB 200 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Hereinafter, the PCB according to the embodiment will be described with reference to FIGS. 15 to 26.

Figure 15:
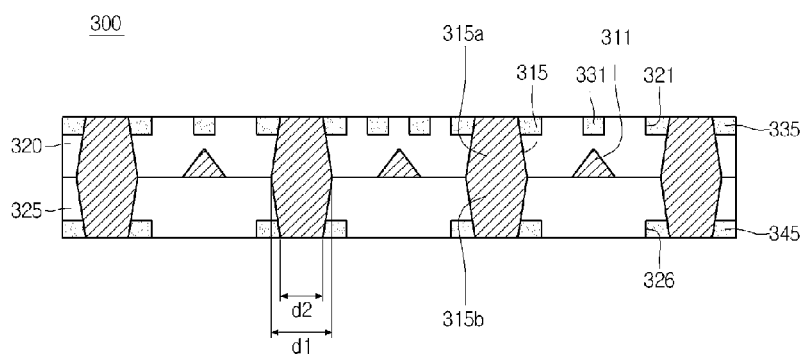
FIG. 15 is a sectional view showing a printed circuit board according to the third embodiment.

FIG. 15 is a sectional view showing the PCB according to the embodiment.

Referring to FIG. 15, the PCB 300 according to the embodiment includes a core insulating layer forming a first insulating layer 320 and a second insulating layer 325, vias 315 formed in the core insulating layer, an inner circuit layer 311 formed in the core insulating layer, and first and second outer circuit layers 331, 335 and 345 formed on the first and second insulating layers 320 and 325, respectively.

The first insulating layer 320 is formed on the second insulating layer 325 and an additional insulating layer (not shown) may be present between the first and second insulating layers 320 and 325.

The first and second insulating layers 320 and 325 may include a thermosetting polymer substrate, a thermoplastic polymer substrate, a ceramic substrate or an organic/inorganic composite substrate. The first and second insulating layers 320 and 325 may include polymer resin, such as epoxy insulating resin, or polyimide resin. In addition, the first and second insulating layers 320 and 325 can be formed by using resin including solid components, such as glass fiber.

The first and second insulating layers 320 and 325 can be formed by using the same material.

The first and second insulating layers 320 and 325 may have a thickness in the range of about 30 μm to about 80 μm, respectively.

The thickness of the core insulating layer having the stack structure of the first and second insulating layers 320 and 325 is in the range of about 60 μm to about 160 μm, preferably, in the range of about 60 μm to about 140 μm. The vias 315 and the inner circuit layer 311 are formed in the core insulating layer.

The vias 315 are conductive vias formed through the first and second insulating layers 320 and 325. The vias 315 have the largest width d1 at the boundary between the first and second insulating layers 320 and 325. The width of each via 315 is gradually narrowed as it reaches the top surface of the first and second insulating layers 320 and 325. Thus, a section of each via 315 meeting with the top surface of the first and second insulating layers 320 and 325 has the smallest width d2, so that the via 315 has a hexagonal sectional shape.

The widths d1 and d2 of the via 315 are in the range of about 20 μm to about 300 μm.

The via 315 is a conductive via and can be formed by using an alloy including Cu.

The inner circuit layer 311 is formed on the second insulating layer 325. A circuit pattern of the inner circuit layer 311 has the thickness in the range of 6 μm to 30 μm, and the width of about 50 μm or less, preferably, 30 μm, so that the micro pattern can be formed.

The inner circuit layer 311 has a triangular sectional shape.

The inner circuit layer 311 can be formed by using a material the same as that of the via 315.

Via pads 335 and 345 connected to the via 315 and pattern grooves 321 and 326 to form the circuit pattern 331 are formed on the top and bottom surfaces of the first and second insulating layers 320 and 325, respectively.

The outer circuit layers 331, 335 and 345 can be formed while filling the pattern grooves 321 and 326.

The outer circuit layers 331, 335 and 345 are classified into the first outer circuit layers 331 and 335 for filling the pattern grooves 321 and 326 formed on the first insulating layer 320, which is an upper layer of the core insulating layer, and the second outer circuit layer 345 for filling the pattern grooves 321 and 326 formed on the bottom surface of the second insulating layer 325, which is a lower layer of the core insulating layer.

The outer circuit layers 331, 335 and 345 can be prepared as a single layer as shown in FIG. 15. In addition, the outer circuit layers 331, 335 and 345 can be prepared as a multiple layer including a lower seed layer and an upper plating layer. The seed layer is shallowly formed along the lateral sides and the bottom surface of the pattern grooves 321 and 326 through the electroless plating, the sputtering, etc.

In addition, the seed layer can be formed by using an alloy including Cu, Ni, Pd, or Cr.

The plating layer is formed on the seed layer through the electroplating process. The plating layer is formed by using an alloy including Cu, Ag, Au, Ni, or Pd and filled in the pattern grooves 321 and 326.

The pattern grooves 321 and 326 formed in the first and second insulating layers 320 and 325 may have the rectangular sectional shape or the curved sectional shape according to the manufacturing method thereof. Preferably, the pattern grooves 321 and 326 have the U-sectional shape.

Although it has been described in that the outer circuit layers 331, 335 and 345 are formed on and under the core insulating layer in the form of a single layer, the embodiment is not limited thereto. For instance, after forming upper insulating layers covering the outer circuit layers 331, 335 and 345 on the first and second insulating layers 320 and 325, respectively, the circuit layer can be formed on the upper insulating layers to form the multi-layer PCB.

As described above, since the inner circuit layer 311 is buried in the core insulating layer of the PCB 300 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 315 including the conductive material are formed in the core insulating layer, the heat dissipation efficiency can be improved.

In addition, the outer circuit layers 331, 335 and 345 can be formed through the plating process after forming the grooves in the insulating layer. In this case, the micro pattern can be formed.

Hereinafter, the method for manufacturing the PCB of FIG. 15 will be described with reference to FIGS. 16 to 26.

Figure 16:
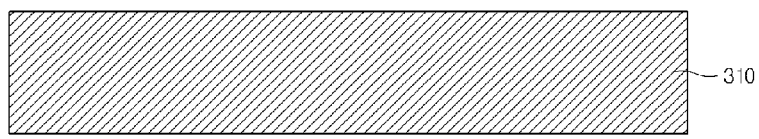
FIGS. 16 to 26 are sectional views for explaining the manufacturing procedure for the printed circuit board shown in FIG. 15.

First, a conductive metal substrate 310 is prepared as shown in FIG. 16.

The conductive metal substrate 310 can be formed by using an alloy including Cu in the form of a rolled foil or an electrolytic foil. The conductive metal substrate 310 may have various thicknesses according to the specification of the product. Preferably, the conductive metal substrate 310 may have the thickness in the range of 80 μm to 170 μm. The surface of the metal substrate 310 can be treated through a surface treatment process, such as pickling or flushing.

Figure 17:
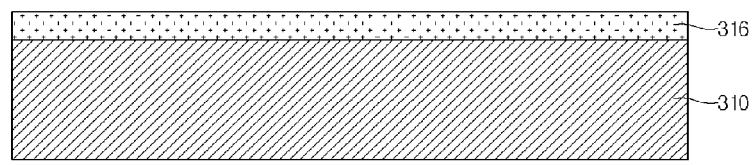

Then, as shown in FIG. 17, a photoresist film 316 is attached onto the top surface of the metal substrate 310.

The photoresist film 316 forms an etching pattern to etch the metal substrate 310. The photoresist film 316 may have various thicknesses in the range of 15 μm to 30 μm, and both of the UV exposure type photoresist film and the LDI exposure type photoresist film can be employed.

Figure 18:
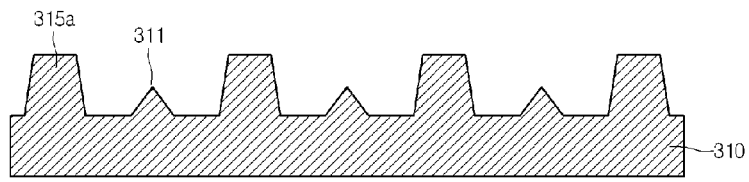

After that, as shown in FIG. 18, the photoresist film 316 is subject to the exposure and development process to form a photoresist pattern (not shown) and the metal substrate 310 is etched by using the photoresist pattern as a mask, thereby forming the first part 315a of the via 315 and the inner circuit layer 311.

Then, a part of the metal substrate 310 is wet etched by using wet etching solution, such as cupric chloride and iron chloride, so that the first part 315a of the via 315 and the inner circuit layer 311 are simultaneously formed. The thickness of the photoresist pattern can be adjusted such that the height of the first part 115a of the via 115 can be different from the height of the inner circuit layer 111.

Although there is height difference between the first part 115a of the via 115 and the inner circuit layer 111, since the first part 115a of the via 115 and the inner circuit layer 111 are simultaneously etched, the inner circuit layer 111 may have the triangular sectional shape.

As shown in FIG. 18, after the first part 315a of the via 315 and the inner circuit layer 311 have been etched, the photoresist pattern is delaminated by using the NaOH diluted solution.

Figure 19:
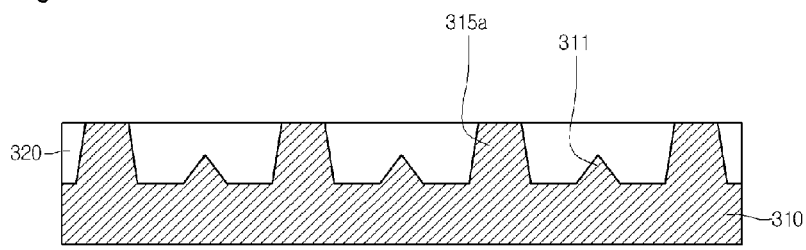

Next, as shown in FIG. 19, the first insulating layer 320 is formed in such a manner that the first part 315a of the via 315 and the inner circuit layer 311 can be buried in the first insulating layer 320.

The first insulating layer 320 can be formed by using thermosetting resin or thermoplastic resin having the solid component, such as glass fiber, or having no solid component. The first insulating layer 320 may have the thickness in the range of about 30 μm to about 80 μm.

Figure 20:
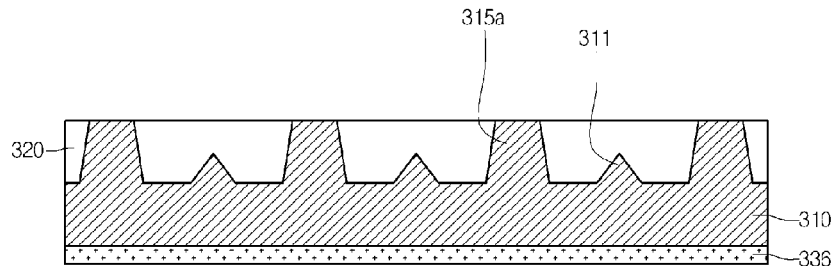

Then, as shown in FIG. 20, a photoresist film 336 is formed on the bottom surface of the metal substrate 310.

The photoresist film 336 formed under the metal substrate 310 serves as a base to form a photoresist pattern used to form the second part 315b of the via 315 and the inner circuit layer 311.

Figure 21:
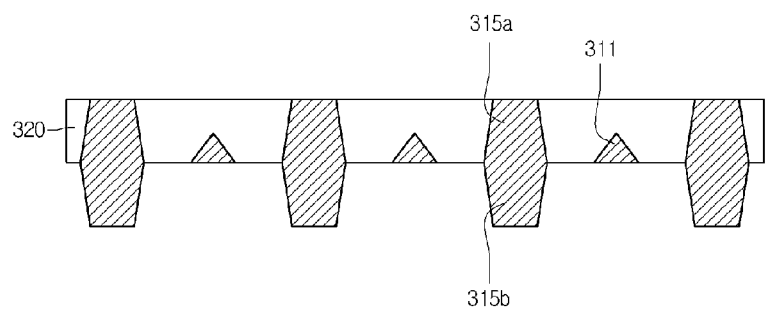

After that, as shown in FIG. 21, the photoresist film 336 formed under the metal substrate 310 is developed to form the photoresist pattern and the metal substrate 310 is etched by using the photoresist pattern as a mask, thereby forming the second part 315b under the first part 315a of the via 315.

In this manner, upper and lower portions of the via 315 are divided into first and second parts 315a and 315b through the etching process so that the via 315 has the hexagonal sectional shape in which the center of the via 315 has the largest width d1 and the width becomes narrow from the center to the outer portion of the via 315.

Figure 22:
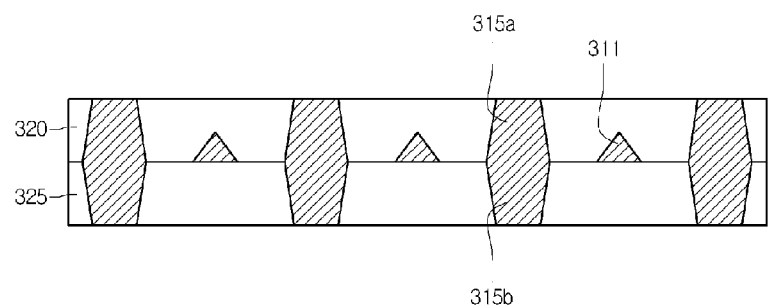

As the second part 315*b* of the via 315 has been formed, the photoresist pattern is delaminated. Then, as shown in FIG. 22, the second insulating layer 325 is deposited such that the first part 315*a* of the via 315 can be buried in the second insulating layer 325.

Figure 23:
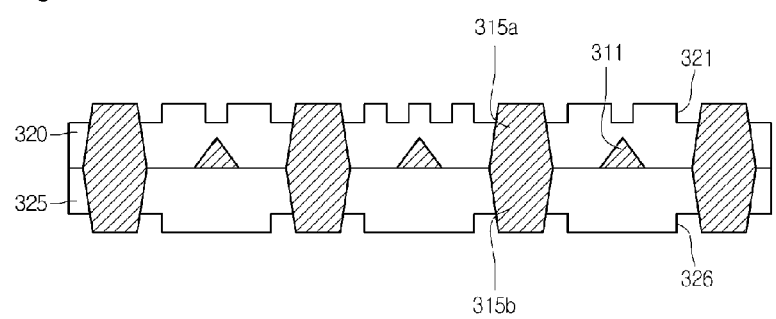

Then, as shown in FIG. 23, the pattern grooves 321 and 326 are formed on the surfaces of the first and second insulating layers.

The pattern grooves 321 and 326 may include via pad grooves for exposing the via and circuit pattern grooves for burying the circuit pattern.

In order to form the pattern grooves 321 and 326 in the first and second insulating layers, an excimer laser using a pattern mask or a UV-YAG laser without using a pattern mask can be used.

If the excimer laser is used, one of XeCl (308 nm), Krf (248 nm) and ArF (193 nm) can be utilized. If the pattern grooves 321 and 326 are formed in the first and second insulating layers, the pattern grooves 321 and 326 have the V-sectional shape or the rectangular sectional shape according to the line/space of the circuit and the vibration depth.

In contrast, if the UV-YAG laser is used, the pattern grooves 321 and 326 have the curved sectional shape. Preferably, the pattern grooves 321 and 326 have the U-sectional shape.

Figure 24:
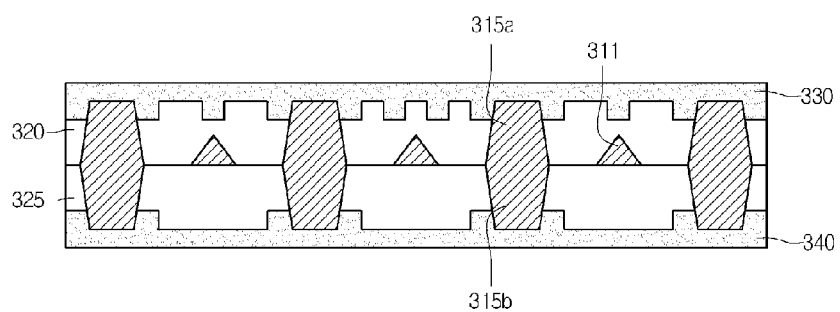

After that, as shown in FIG. 24, the plating layers 330 and 340 are formed to fill the pattern grooves 321 and 326.

In detail, the seed layer is formed over the whole surface of the first and second insulating layers 320 and 325 through electroless plating process. Before the seed layer has been formed through the electroless plating process by using Cu, the pretreatment process, such as the cleanet process, the soft etching process, the pre-catalyst process, the catalyst treating process, or the accelerating process, can be performed.

Meanwhile, the sputtering process can be performed instead of the electroless plating process. According to the sputtering process, ion particles (for instance, Ar+) of gas generated by plasma collide with a copper target to form a copper metal layer on the insulating layers 320 and 325.

In addition, the seed layer can be formed through the electroless plating process or the sputtering process by using a Ni—Pd alloy or a Ni—Cr alloy instead of copper.

Then, the electroplating process is performed on the seed layer to form the conductive plating layers 330 and 340 over the whole area of the first and second insulating layers 320 and 325 such that the pattern grooves 321 and 326 can be filled with the plating layers 330 and 340.

The plating layers 330 and 340 can be formed by using an alloy including Cu, Ag, Au, Ni or Pd. Preferably, the alloy including Cu is plated.

In order to form the plating layers 330 and 340, a substrate is immersed in a plating bath and the electroplating process is performed by using a DC rectifier or a pulse rectifier. According to the electroplating process, the plating area is calculated and current is applied to the DC rectifier or the pulse rectifier to extract the metal.

As described above, the plating layers 330 and 340 shown in FIG. 24 can be obtained through the electroless plating process or the electroplating process. In contrast, the pattern grooves 321 and 326 can be filled by performing the electrodeless plating process with respect to the conductive metal.

Figure 25:
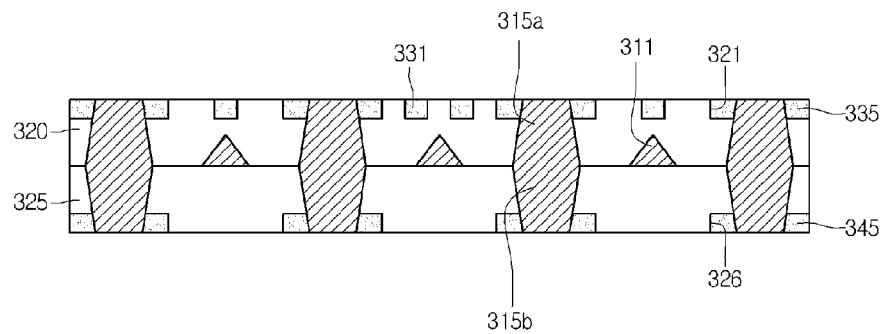

Then, as shown in FIG. 25, the plating layers 330 and 340 and the seed layer are completely removed until the surfaces of the first and second insulating layers 320 and 325 are exposed.

Thus, the outer circuit layers 331, 335 and 345 are formed only in the pattern grooves 321 and 326. The plating layers 330 and 340 can be removed through the flash etching process. If the thickness of the plating layers 330 and 340 to be removed is too heavy, the half etching process may be performed prior to the flash etching process.

Figure 26:
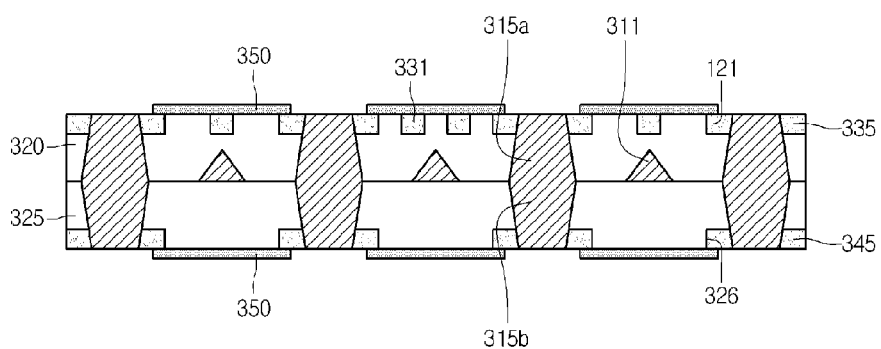

Finally, as shown in FIG. 26, the circuit pattern 331 of the outer circuit layers 331, 335 and 345 is buried and a coverlay 350 is formed to expose the pads 335 and 345.

In this manner, different from the related art in which the via hole is formed by drilling the insulating layer and the via is formed by burying the via hole, the embodiment forms the insulating layers 320 and 325 burying the via 315 after forming the via 315 by etching the metal substrate 310, thereby reducing the manufacturing cost. In addition, since the inner circuit layer 311 is formed by using the metal substrate identical to the via 315, the manufacturing steps can be reduced.

Hereinafter, a PCB according to the fourth embodiment will be described with reference to FIG. 27.

Figure 27:
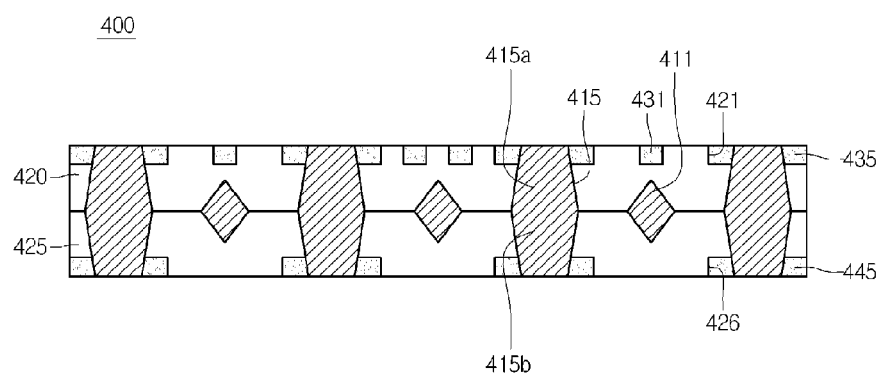
FIG. 27 is a sectional view showing a printed circuit board according to the fourth embodiment.

Referring to FIG. 27, the PCB 400 according to the fourth embodiment includes a core insulating layer forming a first insulating layer 420 and a second insulating layer 425, vias 415 formed in the core insulating layer, an inner circuit layer 411 formed in the core insulating layer, and first and second outer circuit layers 431, 435 and 445 formed in the first and second insulating layers 420 and 425, respectively.

The first insulating layer 420 is formed on the second insulating layer 425 and an additional insulating layer may be present between the first and second insulating layers 420 and 425.

The first and second insulating layers 420 and 425 can be formed by using resin including solid components, such as glass fiber. The first and second insulating layers 420 and 425 can be formed by using the same material.

The first and second insulating layers 420 and 425 have a stack structure to form the core insulating layer. The core insulating layer may have a thickness in the range of about 60 μm to about 140 μm. The via 415 and the inner circuit layer 411 are formed in the core insulating layer.

The vias 415 are conductive vias formed through the first and second insulating layers 420 and 425. The vias 415 have the largest width at the boundary between the first and second insulating layers 420 and 425. The width of each via 415 is gradually narrowed as it reaches the top surface of the first and second insulating layers 420 and 425. Thus, the via 415 has a hexagonal sectional shape.

The widths d1 and d2 of the via 415 are in the range of about 20 μm to about 100 μm.

The via 415 is a conductive via and can be formed by using an alloy including Cu.

The inner circuit layer 411 has a rectangular sectional shape and has the width of about 60 μm or less, preferably, 50 μm, so that the micro pattern can be formed.

The inner circuit layer 411 can be formed by using a material the same as that of the via 415.

Via pads 435 and 445 connected to the via 415 and pattern grooves 421 and 426 to form the circuit pattern 431 are formed on the top and bottom surfaces of the first and second insulating layers 420 and 425, respectively.

The outer circuit layers 431, 435 and 445 can be formed while filling the pattern grooves 421 and 426.

The outer circuit layers 431, 435 and 445 are classified into the first outer circuit layers 431 and 435 for filling the pattern grooves 421 and 426 formed on the first insulating layer 420, which is an upper layer of the core insulating layer, and the second outer circuit layer 445 for filling the pattern grooves 421 and 426 formed on the bottom surface of the second insulating layer 425, which is a lower layer of the core insulating layer.

The outer circuit layers 431, 435 and 445 can be prepared as a single layer as shown in FIG. 15. In addition, the outer circuit layers 431, 435 and 445 can be prepared as a multiple layer including a lower seed layer and an upper plating layer. The seed layer is shallowly formed along the lateral sides and the bottom surface of the pattern grooves 421 and 426 through the electroless plating, the sputtering, etc.

In addition, the seed layer can be formed by using an alloy including Cu, Ni, Pd, or Cr.

The plating layer is formed on the seed layer through the electroplating process. The plating layer is formed by using an alloy including Cu, Ag, Au, Ni, or Pd and filled in the pattern grooves 421 and 426.

The pattern grooves 421 and 426 formed in the first and second insulating layers 420 and 425 may have the rectangular sectional shape or the curved sectional shape according to the manufacturing method thereof. Preferably, the pattern grooves 421 and 426 have the U-sectional shape.

In the PCB 400 shown in FIG. 27, the circuit pattern of the inner circuit layer 411 has a rectangular sectional shape or a lozenge sectional shape, which is symmetrically formed about the boundary between the first and second insulating layers 420 and 425 similar to the via 415. In detail, a part of the inner circuit layer 411 is buried in the first insulating layer 420 and the remaining part of the inner circuit layer 411 is buried in the second insulating layer 425.

Hereinafter, the PCB according to the embodiment will be described with reference to FIGS. 28 to 41.

Figure 28:
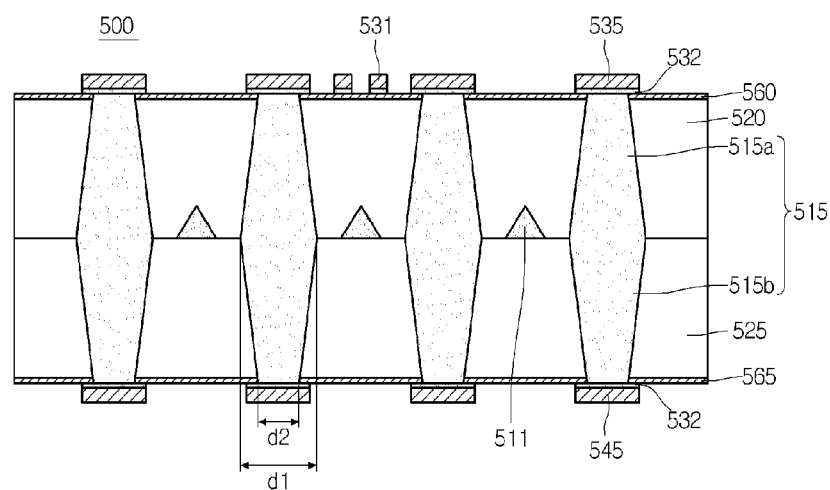
FIG. 28 is a sectional view showing a printed circuit board according to the fifth embodiment.

FIG. 28 is a sectional view showing the PCB 500 according to the embodiment.

Referring to FIG. 28, the PCB 500 according to the embodiment includes a core insulating layer forming a first insulating layer 520 and a second insulating layer 525, vias 515 formed in the core insulating layer, an inner circuit layer 511 formed in the core insulating layer, and first and second outer circuit layers 531, 535 and 545 formed on the first and second insulating layers 520 and 525, respectively.

The first insulating layer 520 is formed on the second insulating layer 525 and an additional insulating layer (not shown) may be present between the first and second insulating layers 520 and 525.

The first and second insulating layers 520 and 525 may include a thermosetting polymer substrate, a thermoplastic polymer substrate, a ceramic substrate or an organic/inorganic composite substrate. The first and second insulating layers 520 and 525 may include polymer resin, such as epoxy insulating resin, or polyimide resin. In addition, the first and second insulating layers 520 and 525 can be formed by using resin including solid components, such as glass fiber.

The first and second insulating layers 520 and 525 can be formed by using the same material.

The first and second insulating layers 520 and 525 may have a thickness in the range of about 30 μm to about 80 μm, respectively.

The thickness of the core insulating layer having the stack structure of the first and second insulating layers 520 and 525 is in the range of about 60 μm to about 160 μm, preferably, in the range of about 60 μm to about 140 μm.

Adhesive layers 560 and 565 are formed on the surfaces of the core insulating layer. In detail, the adhesive layers 560 and 565 are formed on the top surface of the first insulating layer 520 and the bottom surface of the second insulating layer 525, respectively.

The adhesive layers 560 and 565 are provided to reinforce the adhesive strength between the first and second insulating layers 520 and 525 and the circuit layers 531, 535 and 545. The adhesive layers 560 and 565 may be a primer resin layer including silane and may have a thickness of about 10 μm or less.

The vias 515 and the inner circuit layer 511 are formed in the core insulating layer.

The vias 515 are conductive vias formed through the first and second insulating layers 520 and 525. The vias 515 have the largest width d1 at the boundary between the first and second insulating layers 520 and 525. The width of each via 515 is gradually narrowed as it reaches the top surface of the first and second insulating layers 520 and 525. Thus, a section of each via 515 meeting with the top surface of the first and second insulating layers 520 and 525 has the smallest width d2, so that the via 515 has a hexagonal sectional shape.

The widths d1 and d2 of the via 515 are in the range of about 20 μm to about 500 μm.

The via 515 is a conductive via and can be formed by using an alloy including Cu.

The inner circuit layer 511 is formed on the second insulating layer 525. A circuit pattern of the inner circuit layer 511 has the thickness in the range of 6 μm to 30 μm, and the width of about 50 μm or less, preferably, 30 μm, so that the micro pattern can be formed.

The inner circuit layer 511 has a triangular sectional shape.

The inner circuit layer 511 can be formed by using a material the same as that of the via 515.

Outer circuit layers 531, 535 and 545 including via pads 535 and 545 connected to the via 515 and pattern grooves 521 and 526 to form the circuit pattern 531 are formed on the top and bottom surfaces of the first and second insulating layers 520 and 525, respectively.

The outer circuit layers 531, 535 and 545 are classified into the first outer circuit layers 531 and 535 formed on the core insulating layer, and the second outer circuit layer 545 formed on the bottom surface of the core insulating layer.

The outer circuit layers 531, 535 and 545 can be formed by plating materials through the SAP (semi-additive process).

Although it has been described in that the outer circuit layers 531, 535 and 545 are formed on and under the core insulating layer in the form of a single layer, the embodiment is not limited thereto. For instance, after forming an upper insulating layer for burying the outer circuit layers 531, 535 and 545 on the first and second insulating layers 520 and 525, the circuit layer can be formed on the upper insulating layer to form the multi-layer PCB.

As described above, since the inner circuit layer 511 is buried in the core insulating layer of the PCB 500 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 515 including the conductive material are formed in the core insulating layer, the heat dissipation efficiency can be improved.

In addition, since the adhesive layers 560 and 565 including the primer resin are formed between the insulating layers 520 and 525 and the outer circuit layers 531, 535 and 545, the plating work for the outer circuit layers 531, 535 and 545 may be facilitated so that the adhesive strength between the insulating layers 520 and 525 and the outer circuit layers 531, 535 and 545 can be improved.

Hereinafter, the method for manufacturing the PCB of FIG. 28 will be described with reference to FIGS. 29 to 41.

Figure 29:
FIGS. 29 to 41 are sectional views for explaining the manufacturing procedure for the printed circuit board shown in FIG. 28.

First, a conductive metal substrate 510 is prepared as shown in FIG. 29.

The conductive metal substrate 510 can be formed by using an alloy including Cu in the form of a rolled foil or an electrolytic foil. The conductive metal substrate 510 may have various thicknesses according to the specification of the product. Preferably, the conductive metal substrate 510 may have the thickness in the range of 80 μm to 170 μm. The surface of the metal substrate 510 can be treated through a surface treatment process, such as pickling or flushing.

Figure 30:
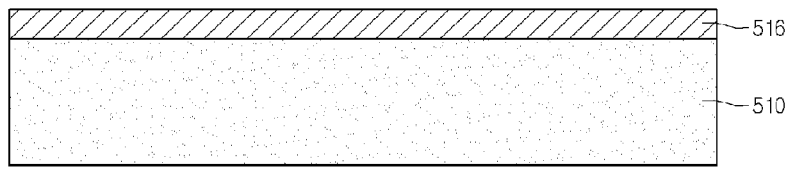

Then, as shown in FIG. 30, a photoresist film 516 is attached onto the top surface of the metal substrate 510.

The photoresist film 516 forms an etching pattern to etch the metal substrate 510. The photoresist film 516 may have various thicknesses in the range of 15 μm to 30 μm, and both of the UV exposure type photoresist film and the LDI exposure type photoresist film can be employed.

Figure 31:
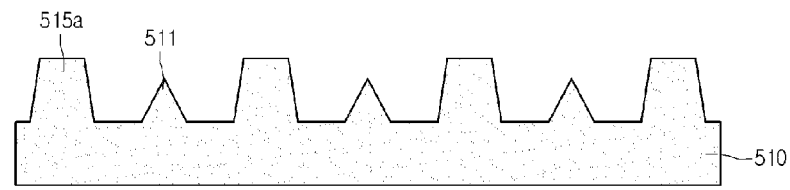

After that, as shown in FIG. 31, the photoresist film 316 is subject to the exposure and development process to form a photoresist pattern (not shown) and the metal substrate 510 is etched by using the photoresist pattern as a mask, thereby forming the first part 515a of the via 515 and the inner circuit layer 511.

Then, a part of the metal substrate 310 is wet etched by using wet etching solution, such as cupric chloride and iron chloride, so that the first part 515a of the via 515 and the inner circuit layer 511 are simultaneously formed. The thickness of the photoresist pattern can be adjusted such that the height of the first part 515a of the via 515 can be different from the height of the inner circuit layer 511.

Although there is height difference between the first part 515a of the via 515 and the inner circuit layer 511, since the first part 515a of the via 515 and the inner circuit layer 511 are simultaneously etched, the inner circuit layer 511 may have the triangular sectional shape.

As shown in FIG. 31, after the first part 515a of the via 515 and the inner circuit layer 511 have been etched, the photoresist pattern is delaminated by using the NaOH diluted solution.

Figure 32:
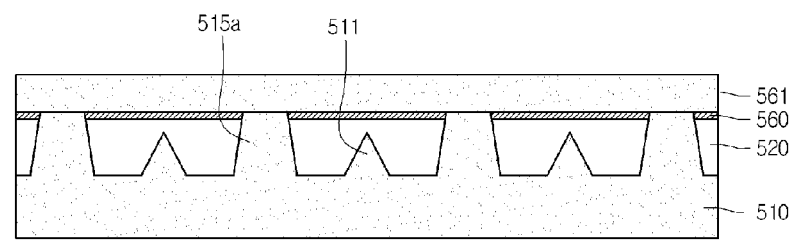

Next, as shown in FIG. 32, the first insulating layer 520 is formed in such a manner that the first part 515a of the via 515 and the inner circuit layer 511 can be buried in the first insulating layer 520.

The first insulating layer 520 can be formed by using thermosetting resin or thermoplastic resin having the solid component, such as glass fiber, or having no solid component. The first insulating layer 520 may have the thickness in the range of about 30 μm to about 80 μm.

Then, the adhesive layer 560 and a copper foil layer 561 are formed on the first insulating layer 520.

The copper foil layer 561 serves as a base for the SAP and the adhesive layer 360 is attached onto the first insulating layer 520. The adhesive layer 560 includes primer resin.

In detail, the adhesive layer 560 includes primer resin including silane. The adhesive layer 560 including the primer resin is coated on the copper foil layer 561 in the form of the PCF (primer coated copper foil).

The top surface of the via 515 is pressed to make contact with the copper foil layer 561 through the adhesive layer 560.

Figure 33:
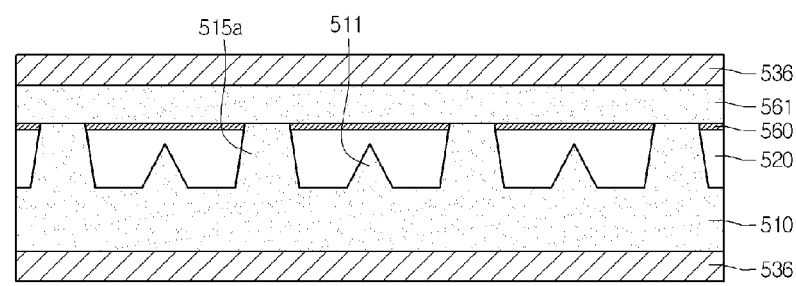

Then, as shown in FIG. 33, photoresist films 536 are formed on the copper foil layer 561 and under the metal substrate 510, respectively.

The photoresist film 536 formed under the metal substrate 510 serves as a base to form a photoresist pattern used to form the second part 515b of the via 515 and the inner circuit layer 511. In addition, the photoresist film 536 formed on the copper foil layer 561 serves as a base to form a photoresist pattern under the metal substrate 510 and as a protective film to protect the copper foil layer 561 during the etching process for the metal substrate 510.

Thus, the photoresist film 536 formed on the copper foil layer 561 can be replaced with a protective film or a protective organic layer and can be omitted.

Figure 34:
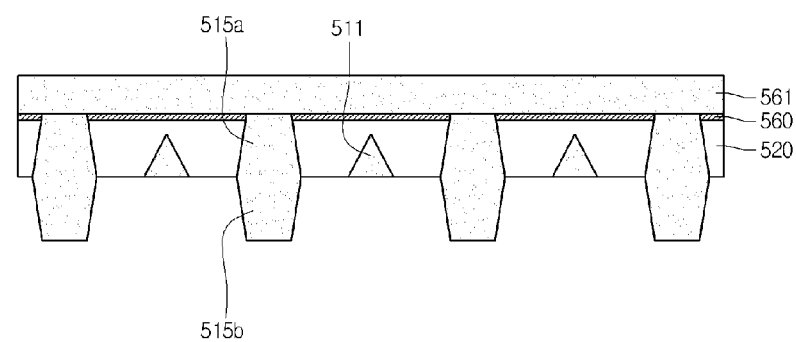

After that, as shown in FIG. 34, the photoresist film 536 formed under the metal substrate 510 is developed to form the photoresist pattern and the metal substrate 510 is etched by using the photoresist pattern as a mask, thereby forming the second part 515b under the first part 515a of the via 515.

In this manner, upper and lower portions of the via 515 are divided into first and second parts 515a and 515b through the etching process so that the via 515 has the hexagonal sectional shape in which the center of the via 515 has the largest width d1 and the width becomes narrow from the center to the outer portion of the via 515.

Figure 35:
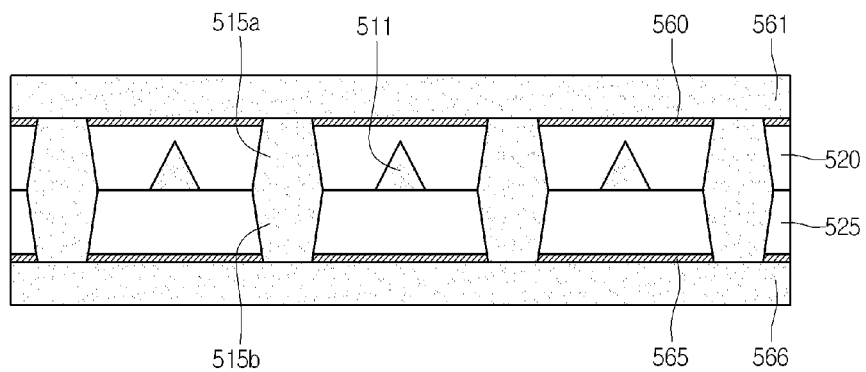

As the second part 515b of the via 515 has been formed, the photoresist pattern is delaminated. Then, as shown in FIG. 35, the adhesive layer 565 and a copper foil layer 566 are formed on the bottom surface of the second insulating layer 525.

The material and the thickness of the second insulating layer 525, the adhesive layer 565 and the copper foil layer 566 may be identical to those of the first insulating layer 520, the adhesive layer 560 and the copper foil layer 561 formed on the first insulating layer 520, respectively.

Figure 36:
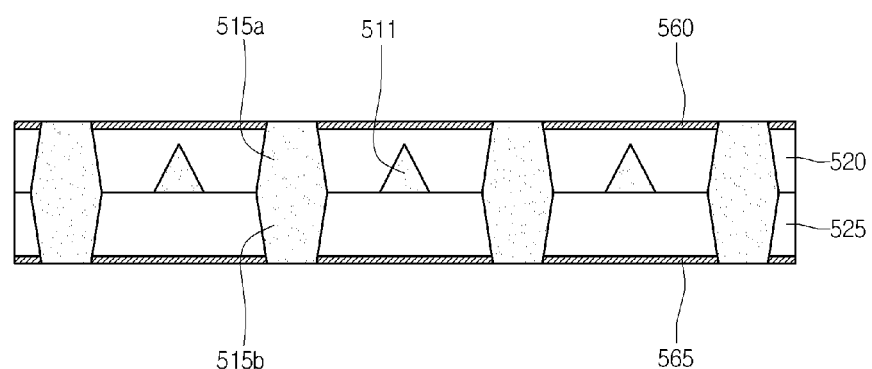

Then, as shown in FIG. 36, the copper foil layers 561 and 566 are removed so that the adhesive layers 560 and 565 under the copper foil layers 561 and 566 can be exposed.

The copper foil layers 561 and 566 are full-etched in order to perform the SAP, and the desmear process can be performed to remove impurities from the adhesive layers 560 and 565 and to provide the intensity of illumination.

Figure 37:
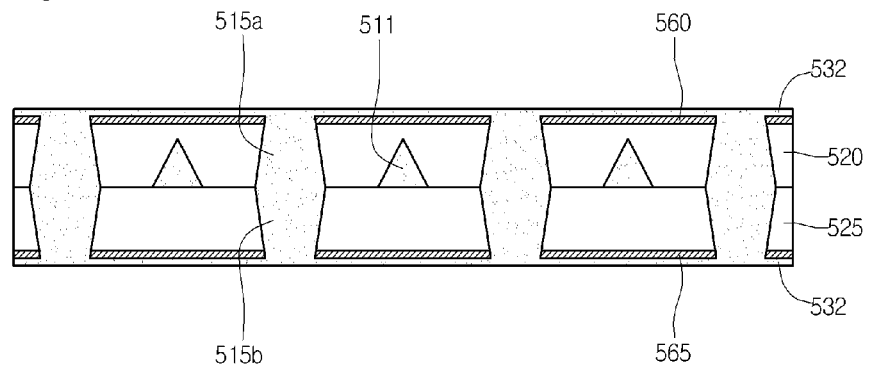

Then, as shown in FIG. 37, a seed layer 532 is formed on the adhesive layers 560 and 565 through the electroless plating process.

That is, the seed layer 532 can be formed by performing the electroless plating process using Cu. The seed layer 532 is formed on the adhesive layers 560 and 565 and on the exposed top and bottom surfaces of the via 515 with the uniform thickness of 3 μm or less.

Figure 38:
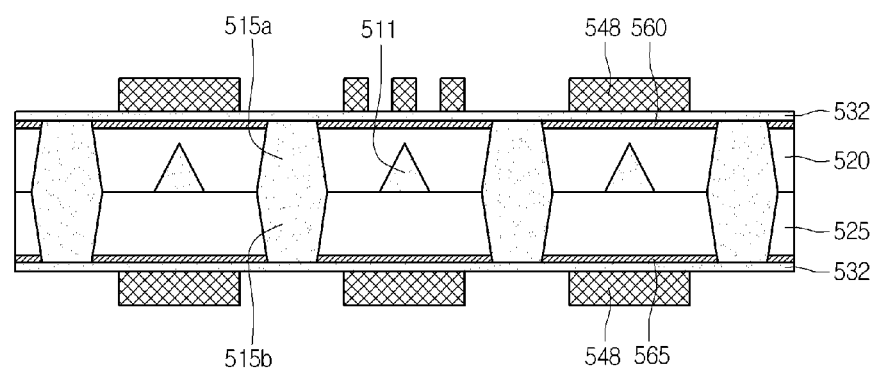

After that, as shown in FIG. 38, a photoresist pattern 548 is formed on the seed layer 532 to form the outer circuit layers 531, 535 and 545.

The photoresist pattern 548 can be formed by performing the exposure and development process with respect to the photoresist film according to the circuit design.

Figure 39:
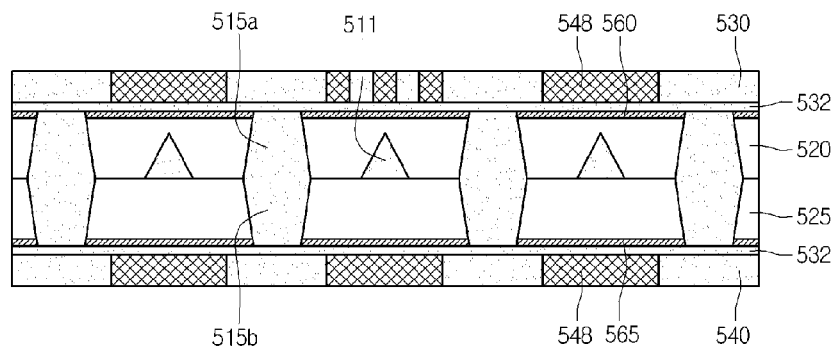

Then, as shown in FIG. 39, plating layers 530 and 540 are formed by performing the electroplating process onto the seed layer 532 exposed through the photoresist pattern 548.

According to the electroplating process, the plating area is calculated and current is applied to a DC rectifier or a pulse/reverse type rectifier to extract the conductive metal, such as copper.

Figure 40:
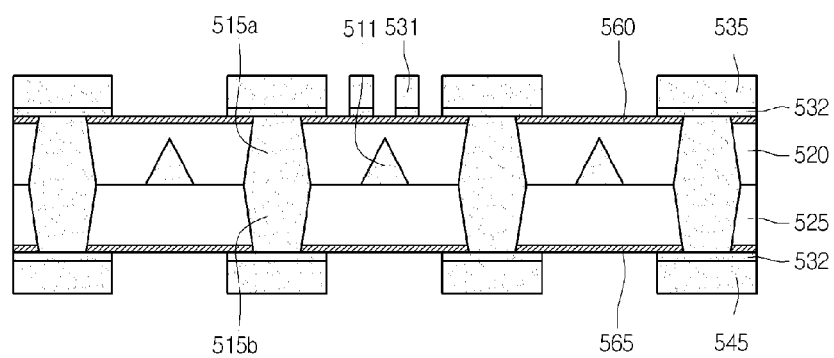

Then, as shown in FIG. 40, the photoresist pattern 548 is delaminated and the flash etching process is performed with respect to the plating layers 530 and 540 and the seed layer 532 under the photoresist pattern 548, so that the adhesive layers 560 and 565 are exposed and the outer circuit layers 531, 535 and 545 are formed.

The pads 535 and 545 and the circuit pattern 531 may constitute the first outer circuit layers 531 and 535 formed on the first insulating layer 520 and the second outer circuit layer 545. The first outer circuit layers 531 and 535 include the upper pad 535 connected to the first part 515a of the via 515 and the upper circuit pattern 531. The second outer circuit layer 545 includes the lower pad 545 connected to the second part 515b of the via 515 and a lower circuit pattern (not shown).

Figure 41:
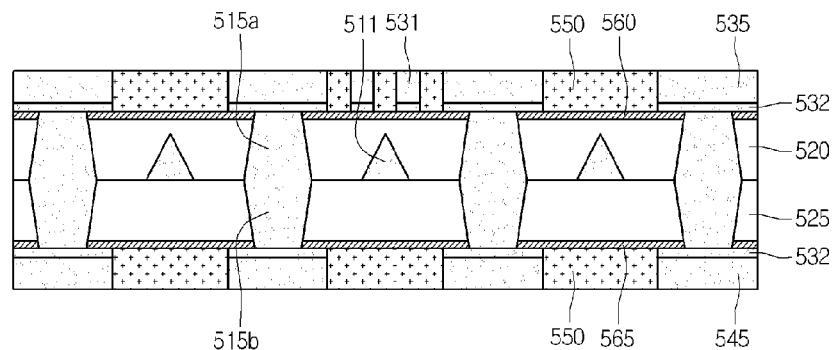

Finally, as shown in FIG. 41, the circuit pattern 531 of the outer circuit layers 531, 535 and 545 is buried and a coverlay 550 is formed to expose the pads 535 and 545.

In this manner, different from the related art in which the via hole is formed by drilling the insulating layer and the via is formed by burying the via hole, the embodiment forms the insulating layers 520 and 525 burying the via 515 after forming the via 515 by etching the metal substrate 510, thereby reducing the manufacturing cost. In addition, since the inner circuit layer 511 is formed by using the metal substrate identical to the via 515, the manufacturing steps can be reduced.

In addition, the outer circuit layers 531, 535 and 545 are formed through the SAP, so that the micro pattern can be formed.

Hereinafter, a PCB according to the sixth embodiment will be described with reference to FIG. 42.

Figure 42:
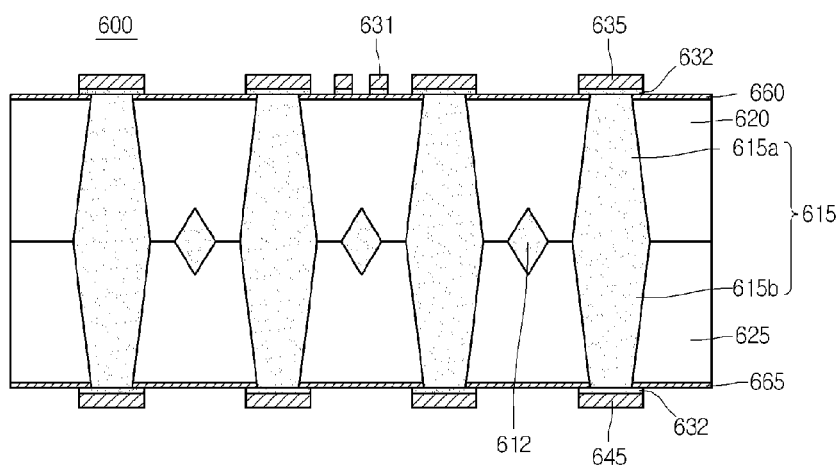
FIG. 42 is a sectional view showing a printed circuit board according to the sixth embodiment.

Referring to FIG. 42, the PCB 600 according to the sixth embodiment includes a core insulating layer forming a first insulating layer 620 and a second insulating layer 625, vias 615 formed in the core insulating layer, an inner circuit layer 612 formed in the core insulating layer, and first and second outer circuit layers 631, 635 and 645 formed on the first and second insulating layers 620 and 625, respectively.

The first insulating layer 620 is formed on the second insulating layer 625 and an additional insulating layer may be present between the first and second insulating layers 620 and 625.

The first and second insulating layers 620 and 625 can be formed by using resin including solid components, such as glass fiber. The first and second insulating layers 620 and 625 can be formed by using the same material.

The first and second insulating layers 620 and 625 have a stack structure to form the core insulating layer. The core insulating layer may have a thickness in the range of about 60 μm to about 140 μm.

Adhesive layers 660 and 665 are formed on the surfaces of the core insulating layer. In detail, the adhesive layers 660 and 665 are formed on the top surface of the first insulating layer 620 and the bottom surface of the second insulating layer 625, respectively.

The adhesive layers 660 and 665 are provided to reinforce the adhesive strength between the first and second insulating layers 620 and 625 and the circuit layers 631, 635 and 645. The adhesive layers 660 and 665 may be a primer resin layer including silane and may have a thickness of about 10 μm or less.

The via 615 and the inner circuit layer 612 are formed in the core insulating layer.

The vias 615 are conductive vias formed through the first and second insulating layers 620 and 625. The vias 615 have the largest width at the boundary between the first and second insulating layers 620 and 625. The width of each via 615 is gradually narrowed as it reaches the top surface of the first and second insulating layers 620 and 625. Thus, the via 615 has a hexagonal sectional shape.

The widths d1 and d2 of the via 615 are in the range of about 20 μm to about 100 μm.

The via 615 is a conductive via and can be formed by using an alloy including Cu.

The inner circuit layer 612 has a rectangular sectional shape and has the width of about 60 μm or less, preferably, 50 μm, so that the micro pattern can be formed.

The inner circuit layer 612 is formed by using a material the same as that of the via 615.

The outer circuit layers 631, 635 and 645 including via pads 635 and 645 connected to the via 615 and the circuit pattern 631 are formed on the top and bottom surfaces of the first and second insulating layers 620 and 625, respectively.

The outer circuit layers 631, 635 and 645 are formed on the surfaces of the first and second insulating layers 620 and 625 and the inner circuit layer 612 is formed on the second insulating layer 625.

The outer circuit layers 631, 635 and 645 can be formed by depositing the copper foil layer and then etching the copper foil layer.

In the PCB 600 shown in FIG. 42, the circuit pattern of the inner circuit layer 612 has a rectangular sectional shape or a lozenge sectional shape, which is symmetrically formed about the boundary between the first and second insulating layers 620 and 625 similar to the via 615. In detail, a part of the inner circuit layer 612 is buried in the first insulating layer 620 and the remaining part of the inner circuit layer 612 is buried in the second insulating layer 625.

The inner circuit layer 612 shown in FIG. 42 can be formed by using the manufacturing method shown in FIGS. 29 to 41.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A printed circuit board comprising:
a first insulating layer;
a second insulating layer under the first insulating layer;
a metal substrate buried in the first insulating layer and the second insulating layer and including a first region and a second region; and
an outer circuit layer on a top surface of the first insulating layer or a bottom surface of the second insulating layer;
wherein the metal substrate comprises:
at least one via formed through the first and second insulating layers and disposed in the first region of the metal substrate;

an inner circuit layer buried in the first and second insulating layers and disposed in the second region of the metal substrate; and an adhesive layer formed on the top surface of the first insulating layer or the bottom surface of the second insulating layer to expose the via;

wherein the via includes a center part having a first width and a contact part having a second width, the contact part makes contact with a surface of the first and second insulating layers, and the first width is larger than the second width;

wherein the inner circuit layer comprises:

a first circuit part buried in the first insulating layer; and a second circuit part buried in the second insulating layer;

wherein a top surface of the via is exposed through the top surface of the first insulating layer, and a bottom surface of the via is exposed through the bottom surface of the second insulating layer; and wherein a sectional shape of the via is different from a sectional shape of the inner circuit layer.

2. The printed circuit board of claim 1, wherein an upper portion of the via from a center part of the via is buried in the first insulating layer; and wherein a lower portion of the via from the center part of the via is buried in the second insulating layer.

3. The printed circuit board of claim 2, wherein the first and second circuit parts of the inner circuit layer are symmetrically formed about a boundary between the first and second insulating layers.

4. The printed circuit board of claim 1, wherein the first circuit part or the second circuit part of the inner circuit layer has a triangular sectional shape.

5. The printed circuit board of claim 1, wherein the first and second circuit parts of the inner circuit layer have a lozenge sectional shape that is symmetrically formed about a boundary between the first and second insulating layers.

6. The printed circuit board of claim 1, wherein the via and the inner circuit layer are formed by using a same material.

7. The printed circuit board of claim 1, wherein the via has a hexagonal sectional shape.

8. The printed circuit board of claim 1, wherein the outer circuit layer is filled in a pattern groove formed on the top surface of the first insulating layer or the bottom surface of the second insulating layer.

9. The printed circuit board of claim 8, wherein the pattern groove has a U-sectional shape.

10. The printed circuit board of claim 1, wherein the adhesive layer includes primer resin.

11. A method for manufacturing a printed circuit board, the method comprising:

forming at least one via and an inner circuit layer by etching a metal substrate;

forming an insulating layer to bury the via; and forming an outer circuit layer on a top surface or a bottom surface of the insulating layer, wherein the forming of the via and the inner circuit layer comprises:

forming a first part of the via and a first circuit part of the inner circuit layer by etching an upper portion of the metal substrate;

forming a first insulating layer to bury the first part of the via and the first circuit part of the inner circuit layer; and forming a second part of the via below the first part of the via and a second circuit part of the inner circuit layer below the first circuit part of the inner circuit layer by etching a lower portion of the metal substrate;

wherein the first circuit part of the inner circuit layer is formed with the first part of the via by using the metal substrate and the second circuit part of the inner circuit layer is formed with the second part of the via by using the metal substrate;

wherein a top surface of the via is exposed through a top surface of the first insulating layer, and a bottom surface of the via is exposed through a bottom surface of a second insulating layer;

wherein a sectional shape of the via is different from a sectional shape of the inner circuit layer; and wherein the forming of the first part of the via comprises:

simultaneously forming the first part of the via and the first circuit part of the inner circuit layer such that the first circuit art of the inner circuit layer has a triangular sectional shape by wet-etching the metal substrate.

12. The method of claim 11, wherein the first and second circuit parts of the inner circuit layer are symmetrically formed about a boundary between the first and second insulating layers.

13. The method of claim 11, wherein the forming of the outer circuit layer comprises:

forming a copper foil layer on and under the insulating layer;

forming a photoresist pattern on the copper foil layer; and forming the outer circuit layer by etching the copper foil layer using the photoresist pattern as a mask.

14. The method of claim 11, wherein a width of a boundary between the first and second parts of the via is larger than a width of a boundary between the via and the insulating layer.

15. The method of claim 11, wherein the forming of the outer circuit layer comprises:

forming a pattern groove on a top surface or a bottom surface of the insulating layer; and filling the pattern groove with a conductive material by plating the conductive material.

* * * * *